United States Patent [19]
Martin et al.

[11] Patent Number: 5,855,727
[45] Date of Patent: Jan. 5, 1999

[54] DECAPSULATOR FOR DECAPSULATING SMALL PLASTIC ENCAPSULATED DEVICE PACKAGES

[75] Inventors: Kirk A. Martin, Aptos; Richard A. Kanishak, Danville, both of Calif.

[73] Assignee: Nisene Technology Group, Santa Cruz, Calif.

[21] Appl. No.: 679,222

[22] Filed: Jul. 12, 1996

[51] Int. Cl.$^6$ .................................................. C23F 1/02
[52] U.S. Cl. ............................................................ 156/345
[58] Field of Search ...................... 156/345 L, 345 LC, 156/345 LS, 345

[56] References Cited

U.S. PATENT DOCUMENTS

| | | | |
|---|---|---|---|
| 4,319,922 | 3/1982 | Macdonald | 75/108 |
| 4,344,809 | 8/1982 | Wensink | 156/345 |
| 5,127,991 | 7/1992 | Lal et al. | 156/659.1 |
| 5,252,179 | 10/1993 | Ellerson et al. | 156/655 |
| 5,271,798 | 12/1993 | Sandhu et al. | 156/638 |
| 5,443,675 | 8/1995 | Wensink | 156/345 |

Primary Examiner—M. Nuzzolillo
Assistant Examiner—Steven H. VerSteeg
Attorney, Agent, or Firm—Skjerven Morrill MacPherson Franklin & Friel LLP; Thomas S. MacDonald

[57] ABSTRACT

An apparatus and method for selectively etching an encapsulant forming a package of resinous material around an electronic device includes a source of etchant solution and an etching assembly including an etch plate and a bell jar or cover, the etch plate and bell jar forming an etching chamber. Optionally, an etch cup or fixture is supported by the etch head or the electronic device package is mountable in the chamber directly on the etch head. A source of pressurized gas such as nitrogen provides a positive pressure about 2 PSI to the bell jar and to flow the etchant solution through the etch head and onto an exterior surface of the electronic device package so that the encapsulant is etched and when break out occurs on a side wall of the package, the pressure in the bell jar is vented to a waste reservoir and the pressure at the etchant solution source is reduced so that etchant solution flow is instantly stopped to prevent any damage to the electronic device by excessive etching.

8 Claims, 4 Drawing Sheets

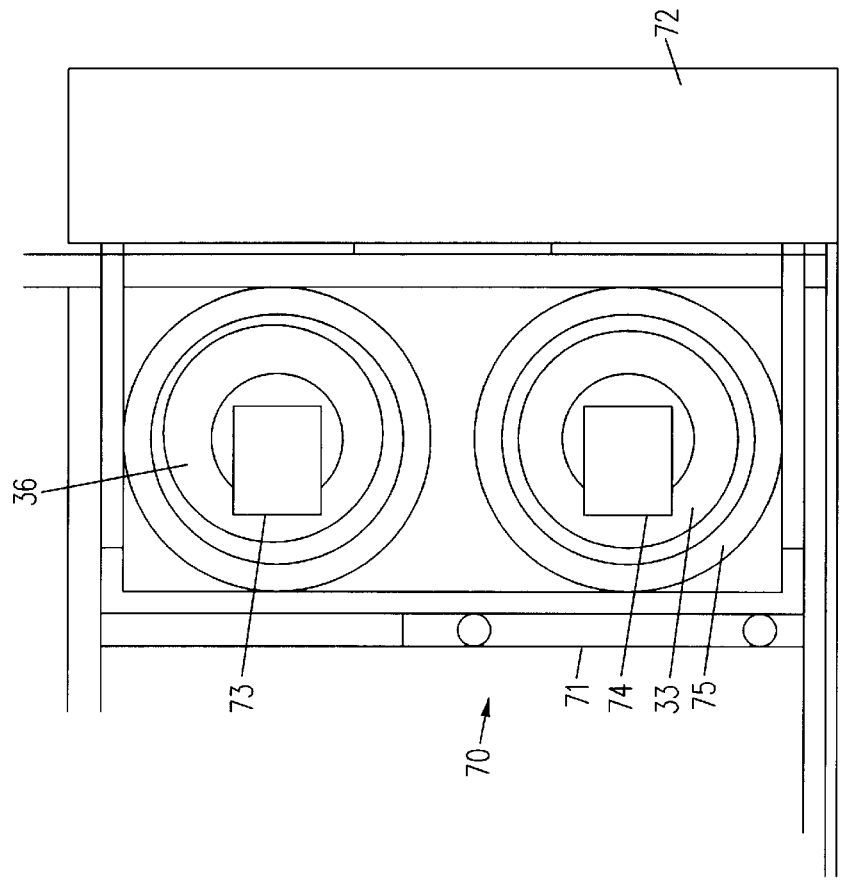
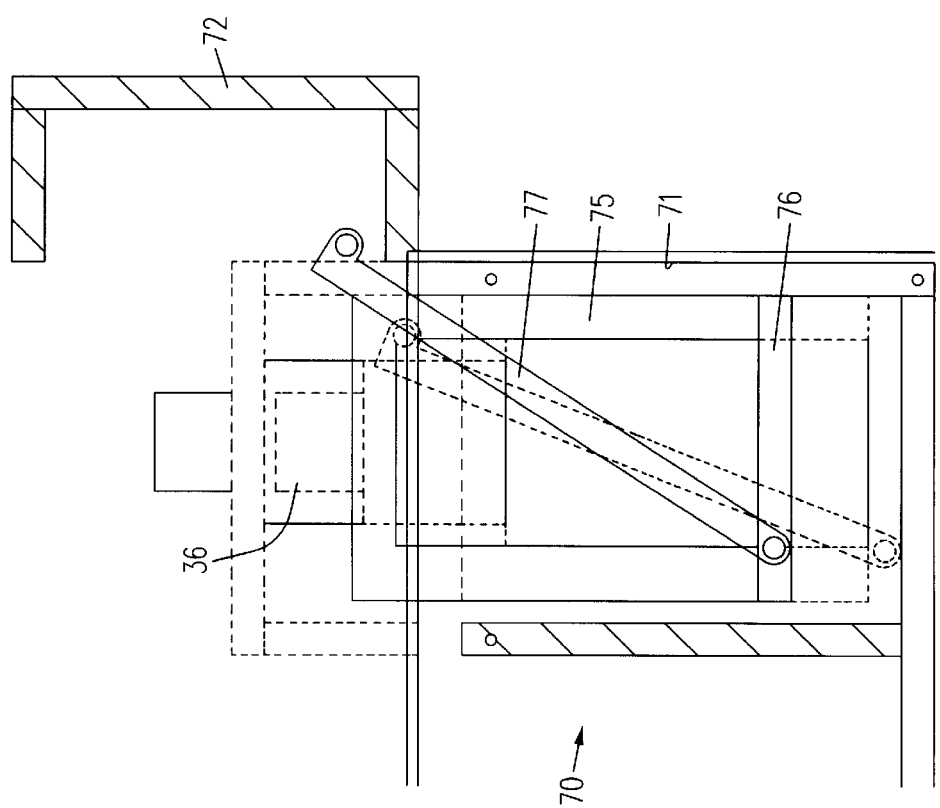
FIG. 6
FIG. 5

DECAPSULATOR FOR DECAPSULATING SMALL PLASTIC ENCAPSULATED DEVICE PACKAGES

RELATED APPLICATION

This application relates to U.S. patent application Ser. No. 08/656,498 filed May 31, 1996, in the name of Kirk A. Martin and entitled Decapsulator and Method for Decapsulating Plastic Encapsulated Device; the disclosure of which is incorporated herein by reference.

FIELD OF THE INVENTION

The present invention relates to an apparatus and method for applying an etchant to a plastic encapsulated device, particularly to a small epoxy encased semiconductor chip, to provide access to the device or chip for internal visual inspection, test and repair and to ensure that the etching process is terminated in a controlled manner.

BACKGROUND OF THE INVENTION

Plastic packaging of various electronic devices including semiconductor chips have been employed for some years. Typically an epoxy resin is molded around the chip, a central portion of a lead frame and bonding wires or other connections between contact pads on the chip to inner lead fingers on the lead frame. It is often desirous to decapsulate the package at least in part to allow for inspection, test and repair of the chip and the wire bonds to the chip and inner lead fingers, after at least part of the epoxy covering these elements is safely and effectively removed.

Commonly, concentrated acids such as sulfuric and nitric acids or other solvents for the resin have been employed. Problems in prior art decapsulators and methods include difficulty in controlling the desired amount of etching, in removing debris formed in the etching process, prevention of damage to the package including interior metallization and providing for adequate safety.

An early patent in the decapsulator art is Wensink U.S. Pat. No. 4,344,809 where a jet etch apparatus includes an etching block and a jet pump provides for etchant flow.

A Decapsulator sold by B&G International, Inc. of Soquel, Calif., namely a Model 250, includes an appropriate acid resistant gasket seated on an etch head and the device to be decapsulated is placed on the gasket. A safety cover closes automatically when the process is started, clamping the device in place. The gasket on the etch head allows the chamber to be sealed and pressurized with nitrogen to approximately two PSI. The etching is started when a metering pump moves etchant from a heat exchanger located in plate with a sinuous passage into a cavity formed by the gasket, the device and the etch head. The acid remains in the chamber for a short period of time, where it reacts with or attacks the encapsulant material. After the etchant has been allowed to work, the pump is activated again and a fresh volume of acid is moved into the cavity. This process continues until the desired amount of device exposure is achieved. When the integrated circuit is exposed at the end of the etch cycle, the pump runs continuously to flush the cavity. After this rinsing period the entire system is purged with nitrogen, blowing all waste materials into the waste bottle. At the end of the process, the safety cover opens automatically and the device is removed for post-etch cleaning.

U.S. Pat. No. 5,252,179 discloses a method and apparatus for selective spray etching of an epoxy encapsulated chip. A diaphragm can be raised or lowered to direct flow of etchant, and debris is removed without moving the chip from the chip carrier. Used etchant is collected and recycled. U.S. Pat. No. 5,127,991 shows a process for etching copper sheets in which a pumped source of etchant is heated. U.S. Pat. No. 5,271,798 shows an etching process for tungsten residue on a semiconductor wafer including a sealed apparatus with an etchant inlet port and suction removal of etching byproduct.

In at least some of the prior art devices various deficiencies have been encountered. For example, a fixed etch head is provided which limits the area of the package which is to be etchant attacked; external auxiliary heaters must be used to heat the etchant; excessive etchant fume or seepage limit seal life; there is inefficient removal of etching debris; a particular slowness of the etching process is present due to non-reactive materials at the etch face; and there is a lack of keeping acid consumption low.

In the related application a first acid-resistant syringe pump operates as a positive displacement pump utilizing a standard syringe as the displacement cylinder and piston connected to a first flow valve. To eliminate any problems resulting from non-pulsing flow, a second acid-resistant syringe pump 40 is positioned upstream of the first valve and in connection to a flow line to introduce an oscillating flow of etchant solution. This second pump will, during the etching portion of the process, keep moving acid into and out of an etched cavity being continually formed on the package exterior which is exposed to the etchant, and which action eventually provides the desired decapsulation of the package.

Small outline transistors, commonly known as SOT'S, typically have a length of about 2 mm a width of about 1 mm and a thickness of about 0.5 mm. The epoxy encapsulation of an SOT typically will have a wall thickness of about 0.25 mm. Special problems have arisen with respect to decapsulating these very small electronic device SOT packages. If the etch process is terminated only on the basis of time of etch, the entire device can be digested with attendant damage to the small electronic device including bonding wires and metallization.

Prior art decapsulation etching has used negative pressure on the waste side of the etch head to transport acid to the device being etched. This process automatically terminates when an air leak is created by the side wall of the etched cavity etching through. The use of negative pressure creates a problem by causing the acid to release vapor in the etched cavity. The vapor prevents even etching and reduces the overall etch rate by reducing the efficacy of the acid. This process will leave acid in the lines between the acid control valves and the etch head because of the termination of all acid transport when an air leak is created. This also prevents rinsing the device being etched at the end of the etch process.

SUMMARY OF THE INVENTION

The present invention relates to an apparatus and method for decapsulation of a packaged electronic device, more particular a SOT, by using a positive pressure to transport the etchant to an etching cavity for removal of elements of the epoxy resin from the etch face. The effect reduces the etch time by providing an automatic cut-off of acid etchant flow and preventing any over-etching or interior destruction or damage of the package being decapsulated. The total cycle time is reduced while keeping acid consumption low. Reduced etchant heat time is also accomplished by providing an aluminum heat exchanger block, with a spiral-ended tube that acid flows through or, as in the related application an alumina ceramic, grooved cylinder heat exchanger or multiple holed alumina block in flow connection to the inlet port, and an aluminum heater block containing at least one resistance heater. Thus only a relative small volume of etchant need be heated immediately prior to the flow of the etchant against the package, lessening the overall decapsulating time.

The apparatus for selectively etching an encapsulant forming a package around an electronic device includes a source of etchant solution; an etching assembly including an etch plate and a movable cover such as a bell jar, the etch plate and cover forming an etching chamber; an optional etch cup or fixture customized for a particular IC package i.e., package specific, supported by the etch head; and a source of pressurizing gas connected to the etchant source and the bell jar. An electronic device package to be decapsulated is mounted in the chamber on the etch head top surface or on the fixture. A first pressurized conduit is provided for transporting a quantity of etchant solution from an etchant source (such as acid bottle) into the etch head onto an adjacent abutting surface of the SOT encapsulant and then into an etched cavity formed on an exterior surface of the SOT or other electronic device package. Debris from the etching of the package is forced through a waste outlet extending from the etch head to a waste reservoir. Etching continues until there is a breakthrough in the encapsulant allowing the positive pressure in the bell jar to vent through the etched opening and to the waste outlet. This action simultaneously stops the pressurization of the acid bottle and hence the acid flow from the bottle.

In another embodiment an apparatus for selectively etching an encapsulant forming a package around an electronic device includes a source of etchant solution; an etching assembly including an etch head and a movable cover, the etch plate and cover forming an etching chamber. An electronic device package to be decapsulated is mounted in the chamber on the etch head. The etch cup or fixture includes a demountable cylindrical plug, O-ring sealed on the bottom of the etch cup, the cup having a central passageway extending through to the etch head, in flow connection to the source of etchant solution. The etch head assembly may include a spiral flow passage or spiral tubing for transferring heat from a resistance heater in the assembly to heat the flowing acid to a desired etching temperature. A waste passage or tube(s) extend from the etch cavity through the assembly to the waste bottle. The electronic device package is mounted in an etch cup or fixture or placed directly on a surface of the etch head facing the etching chamber.

In addition to the above, in one embodiment a first three-way valve and an acid bottle valve is opened to provide a positive pressure to a bell jar and an acid bottle, respectively. After etching a purging valve is employed to effectively rinse by flowing pressurization gas such as nitrogen through the purging valve into the bell jar chamber to clear any acid remaining on the device or in the acid lines. The first three-way valve, the acid flow valve and the purge valve are provided in a combined housing. Following completion of a cycle, another three-way valve is opened to vent the bell jar and through the opening of the acid bottle valve to vent the acid bottle.

The problems of the prior art of over etching causing damage to the SOT or other electronic device can be reduced by using positive pressure to transport the acid and to pressurize the bell jar.

BRIEF DESCRIPTION OF DRAWINGS

FIG. 5 is a side view partially in section of a containment housing for the acid and waste bottles.

FIG. 6 is a top view thereof with the cover also in the open condition.

DETAILED DESCRIPTION

Figure 1:
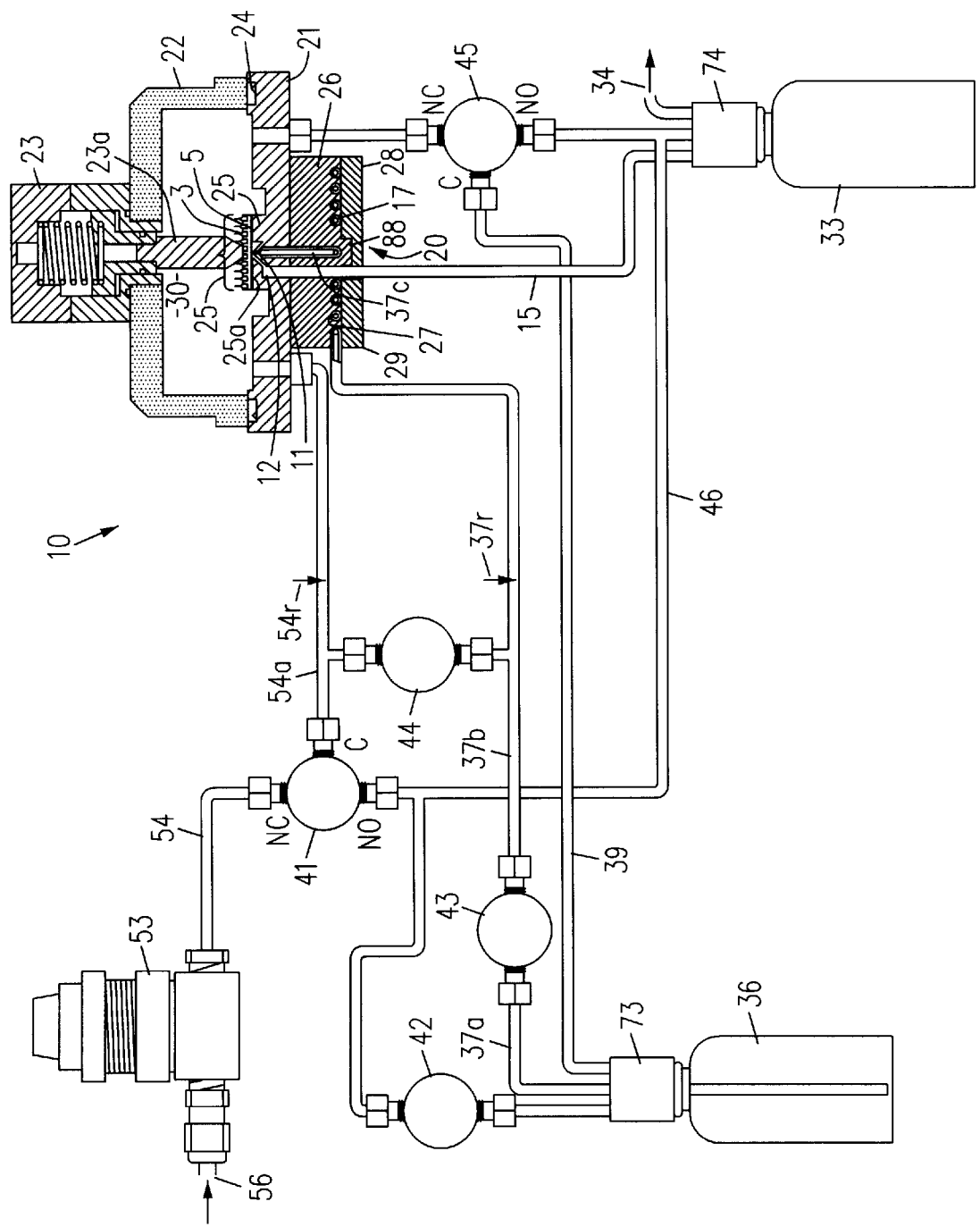
FIG. 1 is a schematic side view partially in section of the overall decapsulation apparatus.
Figure 8:
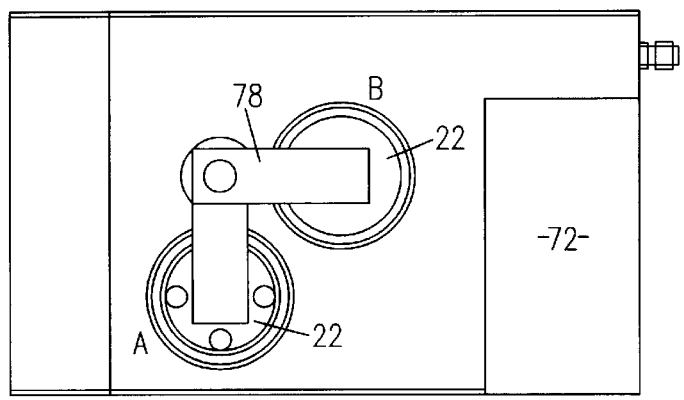
FIG. 8 is a top view thereof.

FIG. 1 shows a decapsulating system 10 including an etch head assembly 20 including an etch plate 21, an integral etch head 25 centrally of the plate, and a movable cover or bell jar 22 capable of being lifted and pivoted by structure (FIGS. 7 and 8) onto the etch plate 21. The interior of the bell jar forms an etching chamber 30. A spring pressed holder 23 with a ram nose 23a holds the SOT electronic device package 3 to be decapsulated against the etch cup or fixture or against an etch head top surface 25a and is sealed thereto by a gasket or seal 5. The etch head 25 includes an etchant solution inlet passage 11 and waste outlet passages 12 leading to a waste tube 15 extending through a bore in a heat exchanger block 26. Block 26 abuts the bottom of the etch head 25 and includes a spiral passageway 27 on its underside for receiving spirally-formed tubing 17 for heating etchant solution flowing through the tubing passageway. A heater block 28, including one or more resistance heaters 29, abuts against the bottom spiral tubing 17 and the heat exchanger block 26.

When no process is running, valve 41 is off, shutting off the low pressure to the entire unit. Valve 42 is open venting the acid bottle 36 and valve 45, is off, also venting the acid bottle. When an etch process is started, valves 41, 42 and 45 are activated allowing the bell jar and the acid bottle to pressurize to about 2 PSI. When valve 43 opens, the $N_2$ pressure through line 54 forces the acid from the bottle 36 through line 37a, through open valve 43, through line 37b, through a venturi flow restrictor 37r that controls acid flow volume, through the heat exchanger or other reservoir and through inlet passage 11 to impinge on the device to be etched. Acid will continue to flow as long as the device is sealed to the etch head.

As soon as a vertical side wall, i.e. a wall not including the surface being etched, of the package by formation of the etched cavity is etched through, i.e. a break-out occurs, the pressure inside the bell jar vents through outlet passage(s) 12 to the waste line 15 and to waste bottle 33 or other reservoir. This also increases the pressure in the acid lines 11, 37c, tubing 17, 37b and 37a and reduces the pressure in the acid bottle. This increased pressure, when it reaches restrictor 37r essential blocks acid flow to the etch head. This prevents any further flow of acid. At the end of the etch process, valve 43 is allowed to close and valve 44 is opened. This pressurizes the acid carrying tubing 17 in the heat exchanger to greater than the pressure at the etch head and purges the heat exchanger of acid. This purge also rinses any remaining etch debris from the device being etched or in passage 12 and line 15 to waste bottle 33. Also, the valve 45 is positionable to connect the acid bottle 36 through line 39 to waste bottle 33 with valve 43 closed to vent the acid bottle 36.

The pressurization of the acid bottle 36 can only happen when the bell jar 22 is down on the etch plate and sealed thereon by seal 24. This prevents any possibility of acid transport when the etch head is exposed. The acid bottle is vented through both valve 42 and 45, requiring both valves to fail in the active state for pressure to remain in the acid bottle. The bell jar itself with a venturi flow restrictor 54r in line 54a, operates as a pressure relief valve. The closing pressure on the bell jar is limited to about 45 pounds. If the pressure inside the bell jar exceeds about 3 PSI, the bell jar will lift slightly venting the excess pressure across seal 24. As the pressure to the acid bottle is supplied from the bell jar, this limits the maximum pressure in the acid bottle 36. Additionally, both the source and waste bottles are fully enclosed each in its own secondary containment chamber, as seen in FIGS. 5 and 6.

An etchant solution, such as nitric acid, in particular fuming nitric acid, is utilized as an etching agent.

A standard low pressure regulator 53 such as Part No. 101-3008-1, available from Monnier Co. of Algonec, Mich. supplies the nitrogen gas for acid flow and for purging. About 40 psi of nitrogen gas is supplied (not shown) through inlet 56 to operate the pneumatic controls (not shown) for the various valves. Valves 41, 42, 43, 44 and 45 may be Teflon® diaphragm pneumatically actuated valves as shown in FIG. 2.

To effectively transport etch debris and create a clean cavity, a flow rate of about 3 to about 5 ml per minute of acid is required. This is supplied by adjustment of the nitrogen pressure so that the inert gas pressure is between about 1.5 psi to about 3 psi. The acid and waste bottles typically are constructed of Teflon molded plastic or glass.

The etching procedure, in general, comprises 1) opening valves 41 and 45 and closing valve 42 to pressurize both the interior of the bell jar 23 and the acid bottle 36; 2) valve 43 is intermittently activated (opened) to pulse the acid flow to reduce acid consumption and to allow acid flow to the encapsulated package 3; 3) etching continues until break-out of the encapsulant; 4) when break-out occurs the bell jar pressure and the acid bottle pressure vent through the break-out to the waste lines, automatically stopping the acid flow and further etching; 5) valve 43 is then closed and valve 44 is opened clearing the acid lines by $N_2$ pressure while momentarily opening valve 43 to purge all the acid back to bottle 36; and 6) at the end of the cycle, valve 45 is closed and valve 42 is opened to vent the acid bottle. Valve 41 is closed to shut off the $N_2$ flow and vent the bell jar. Tubing line 46 extends between valve 41 and the waste bottle 33 to vent from the acid bottle through open valve 42 and line 38, to vent the bell jar through vent outlet 34.

Figure 2:
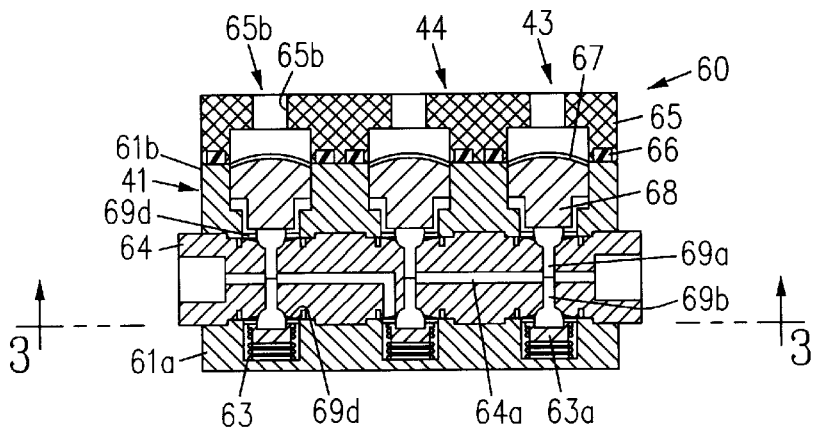
FIG. 2 is a cross-sectional side view of the combined valves and housing.
Figure 3:
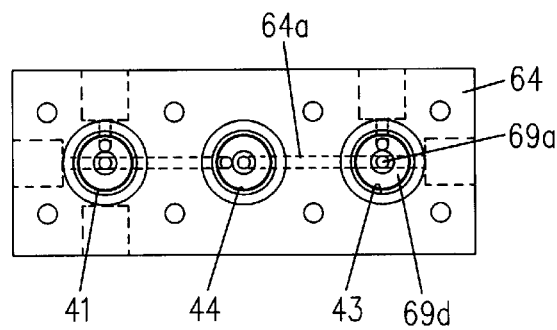
FIG. 3 is a bottom view taken on line 3—3 of FIG. 2 and top view of the valve block thereof.
Figure 4:
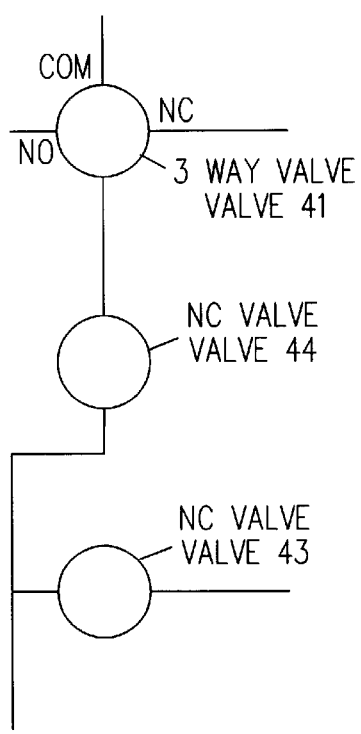
FIG. 4 is a schematic sketch of the interconnections of the valves in the combined housing.

FIG. 2 and 3 illustrate a single combined housing 60 for valves 41, 44, and 43. First rectangular housing member 61a includes three spring valve closure members 63 including a spring guide 63a. A rectangular valve block 64 contains the valve seats and flow passages. A second rectangular housing member 61b seats on valve block 64. A rectangular valve cover 65 having inlets 65a is sealed by gaskets 66 to housing member 61b. Each valve includes an activation diaphragm 67 which moves an actuator 68 and diaphragm stem 69a into abuttment with a diaphragm stem 69b attached to a diaphragm 69d which is spring pressed inwardly by spring guide 63a and spring 63. Air pressure enters the chamber, housing diaphragm 67, through aperture 65b. A push-pull operation of the diaphragm stems permits pressure flow through central passage 64a from valves 41, 44 and 43, the full diameter of the items blocking $N_2$ flow and the tapered ends of the stems permitting $N_2$ flow. FIG. 4 shows the various positions of three-way valve 41 namely NO standing for Normal Open, COM standing for Common, and NC standing for Normal Closed.

FIGS. 5 and 6 illustrate a protective housing 70 for the acid and waste bottles including a rectangular housing 71, a hinged cover 72 and an acid bottle manifold 73 and waste bottle manifold 74, such that when the cover 72 is closed the cover acts as a safety cover for each of the acid and waste bottles. A secondary containment is provided by a PVC pipe 75 surrounding each of the bottles and glued to a movable liftable plate 76 connected by arm 77 to cover 72. Upon opening the cover, plate 76 rises moving the bottles upward for ease of access. The dashed lines show the cover closed and the plate 76, pipe 75 and bottles "down" in the housing 70.

Figure 7:
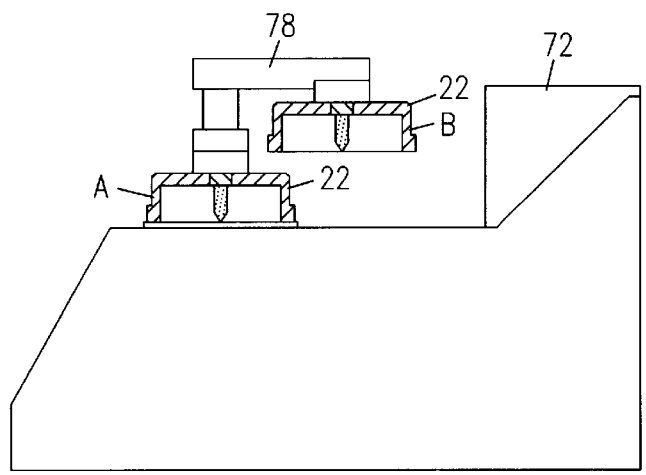
FIG. 7 is a side view partially in section of the overall device showing the bell jar mounting procedure.

FIG. 7 illustrates another embodiment of the acid bottle cover where cover 72 covers the acid bottle and a robotic actuator 78 moves the bell jar 22 from an etch position A to a raised, offset position B for placement of and removal of the encapsulated and decapsulated electronic device.

Figure 9:
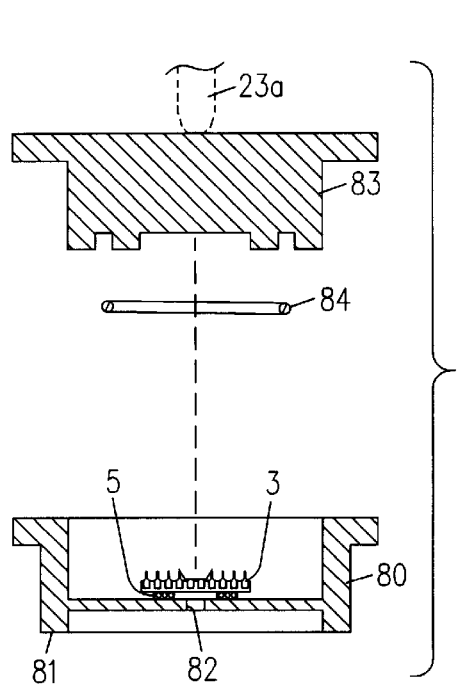
FIG. 9 is a cross sectional view of an etch cup and plug embodiment.

FIG. 9 illustrates one form of a cylindrical PTFE Teflon etch cup 80 having a bottom surface 81 which seats on the etch head 25 (FIG. 1). A circular aperture 82 allows access of acid to a device 3 to be decapsulated, mounted in the cup. The device 3 is sealed by annular seal 5 as in FIG. 1. A cylindrical Teflon plug 83 is press-fitted into the cup with an O-ring seal 84. The ram nose 23a presses down on the top of plug 83.

Figure 10:
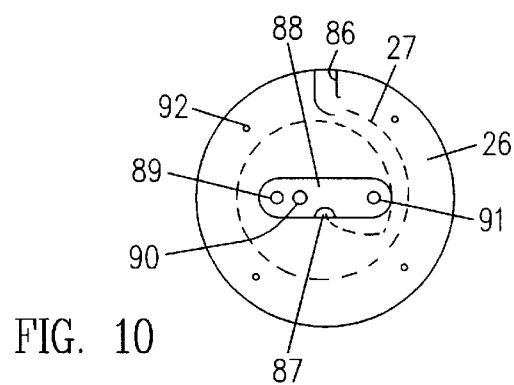
FIG. 10 is a bottom view of the heat exchanger block.
Figure 11:
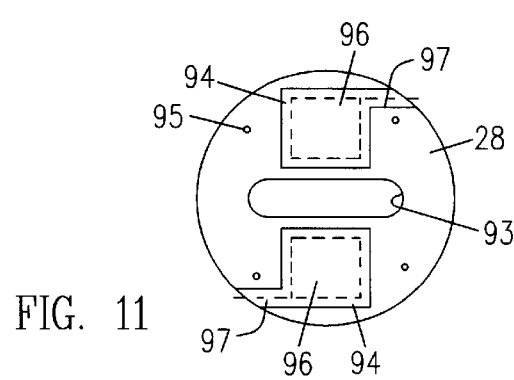
FIG. 11 is a top view of the heater block showing the surface interfacing with the surface shown in FIG. 10.

FIGS. 10 and 11 illustrate the interface between heat exchanger block 26 and heater block 28. The underside of heat exchanger block 26 in FIG. 10 includes a milled spiral groove 27 (dashed lines) which extends from a peripheral edge entry 86 to a milled entry port 87 of an oval integral Teflon® extension 88, depending from block 26 (FIG. 1). Tubing 17 extends along the grooves 27. The extension includes a pressurizing hole 89, a waste outlet hole 90 and a vent hole 91, and bolt holes 92 for assembly with the heater block 28. Facing the extension 88 is the aluminum heater block 28 which includes an oval slot 93 for press-fitted reception of the extension 88. Milled slots 97 are provided for a connector part of resistance heaters, are provided on opposite sides of the slot 93. The slots 97 lead to a rectangular milled areas 94 of about 0.25 mm deep, into which rectangular flat "pancake" resistance heaters 96 are placed. Bolt holes 95 match bolt holes 92 in block 26 and are aligned when extension 88 is placed in the slot 93.

In the decapsulation process using the above described apparatus, the etch may be a timed etched, for example, for 30 seconds but, if for any reason such as a thinner package wall or excess etching attack, the integrity of a package wall is broken prior to the 30 seconds, the 2 psi pressure in the bell jar will vent to the waste lines 12, 15 above seal 5 (FIGS. 1 and 9) stopping all flow from the acid bottle. Seal 5 only seals the IC package surface which faces the etch head or the bottom of the etch cup, if such a fixture is being used.

A small local processor (not shown), such an a PIC 16C55 processor available from Microchip Technologies of Chandler, Ariz., as is known in the art is used to control the valve functions. The control electronics are distributed between the multi-controller and the processor in the etcher unit. The multi-controller provides the user interface and the supervisory control of the etcher unit. A temperature control sub-processor (not shown) measures the output of the resistance heater, ambient temperature, line voltage, and current into the heaters. It adjusts the current into heaters based on the difference between the desired temperature of the heat exchanger and the actual temperature thereby controlling the heat exchanger temperature. A multi-controller (not shown) is used to send commands to the local processors and the local processor performs the actual valve and temperature control.

Etchant selection, safety equipment for the operator, unit set-up details of a typically used controller modified for use with the valve system of the invention, and general mechanical and electrical operations of a typical decapsulator are in the Model 250 Operation, Installation and Service Manual, the content of which are incorporated herein by reference.

All components, other than springs, screws, and selected valve components, are made of Teflon® plastic, glass, polypropylene, or PVC or other acid-resistant material. The only metal components utilized are the springs and screws which, where possible, are made of stainless steel. All five valves are normally open in a non-operational status and are pneumatically activated when decapsulation is being performed as described above. All manifold ports are the standard ¼ 28 thread.

The above description of the preferred embodiments of this invention is intended to be illustrative and not limiting. Other embodiments of this invention will be obvious to those skilled in the art in view of the above disclosure.

We claim:

1. An apparatus for selectively etching an encapsulant forming a package of resinous material around an electronic device comprising:
    a source of etchant solution;
    an etching assembly including an etch plate and a movable bell jar, said etch plate and bell jar forming an etching chamber;
    an etch head supported by said etch plate, wherein an electronic device package is mountable in said chamber on said etch head;
    a waste outlet extending from said etch head to disposal;
    a positive gas pressure source for pressurizing said etching chamber and for supplying positive pressure to move the etchant solution from said source into said etch head; and
    wherein when said etchant solution has etched through an exterior surface of the electronic device package by reaction of the etchant solution with the resinous material, the positive pressure in said etching chamber and in said source vents to said waste outlet, stopping etchant solution from moving from said etchant source.

2. The apparatus of claim 1 wherein said pressure source is a supply of nitrogen gas and further including a nitrogen gas pressure regulator furnishing about a 2 PSI pressure to said etching chamber and said etchant solution source.

3. The apparatus of claim 1 further comprising a flow line extending from said source of etchant solution to said etch head;
    a first valve in said flow line between said etchant solution source and said etch head such that when said first valve is open, a supply of etchant solution flows through the flow line to said etch head of and, a second valve between said pressure source and said etchant solution source such that when said first valve is closed, and second valve is open said etchant solution source is vented to waste.

4. The apparatus of claim 3 further comprising a third valve extending between said pressure source and said flow line upstream of said first valve, such that upon closure of said first valve, pressure from said pressure source clears out any residual etchant solution in said flow line and in said etch head.

5. The apparatus of claim 4 further comprising a first three-way valve between said pressure source and said second valve and between said pressure source and said etching cavity; and a second three-way valve between said etching cavity and to said etching solution source and between said etching cavity and to said etching solution such that etching solution vapors are ventable to waste.

6. The apparatus of claim 5 wherein said valves are push-pull valves, each valve including a spring-containing first housing, a first diaphragm, a diaphragm stem attached to said first diaphragm and intersecting a central passage in a valve block and a second diaphragm, a second diaphragm stem and actuator block-containing second housing abutting said valve block for moving said stems in and out of said passage.

7. An apparatus for selectively etching an encapsulant forming a package around an electronic device comprising:
    a source of etchant solution;
    an etching assembly including an etch plate and a movable bell jar, said etch plate and bell jar forming an etching chamber;
    an etch head supported by said etch plate, wherein an electronic device package is mounted in said chamber on said etch head; and
    a source of inert pressurizing gas for positively pressurizing said etching chamber and said etchant solution source for moving etchant solution through said etch head against the package to be encapsulated;
    a waste reservoir; and
    wherein, when the package is etched through, the positive pressure in said etching chamber is vented to said waste reservoir and the positive pressure in said etchant solution source is reduced causing stoppage of the flow etchant solution to said etch head.

8. The apparatus of claim 7 further comprising a first valve in flow connection between said source of etchant solution and said etch head for moving etchant solution into said etch head and a second valve, such that when said first valve is closed and said second valve is open, said etchant solution source is vented to waste.

* * * * *